United States Patent
Jeng

(10) Patent No.: US 7,223,630 B2
(45) Date of Patent: May 29, 2007

(54) LOW STRESS SEMICONDUCTOR DEVICE COATING AND METHOD OF FORMING THEREOF

(75) Inventor: Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 236 days.

(21) Appl. No.: 11/004,688

(22) Filed: Dec. 3, 2004

(65) Prior Publication Data
US 2006/0121720 A1  Jun. 8, 2006

(51) Int. Cl.
H01L 21/50 (2006.01)
H01L 21/48 (2006.01)

(52) U.S. Cl. ............... 438/106; 257/758; 257/E23.001; 257/E21.499

(58) Field of Classification Search .......... 257/758, 257/E23.001, E21.499; 438/106
See application file for complete search history.

(56) References Cited

U.S. PATENT DOCUMENTS 4,928,162 A * 5/1990 Lesk et al. .................. 257/693
5,572,067 A * 11/1996 Thalapaneni ................ 257/669
5,736,607 A * 4/1998 Martin et al. ............... 524/609
6,462,401 B2 10/2002 Fujii
6,500,770 B1 12/2002 Cheng et al.
6,580,170 B2 6/2003 Swanson et al.
6,674,158 B2 1/2004 Blalock

OTHER PUBLICATIONS

Loke, A.L.S., et al., "Electrical Stability of Low-K Polyimide/TEOS Interface," Advanced Metallization and Interconnect Systems for ULSI Applications (Oct. 1, 1997) pp. 1-7.
Cheang, P., et al. "Optimization of Photosensitive Polyimide Process for Cost Effective Packaging," Surface Mount Technology Seminar (1996) pp. 1-18.

* cited by examiner

Primary Examiner—Asok Kumar Sarkar
(74) Attorney, Agent, or Firm—Slater & Matsil, L.L.P.

(57) ABSTRACT

A low stress, protective coating for a semiconductor device and a method for its manufacture. A preferred embodiment comprises coating the top surface of a semiconductor die with polyimide except for corner regions of the die. Not having corners in the polyimide protective overcoat generally reduces shear stresses in the die. Reducing stress, in turn, generally reduces the occurrence of problems such as fracture, delamination, or cracking within the die. A low stress coating may be particularly advantageous in semiconductor devices having low-k insulating materials, which are generally of low mechanical strength.

33 Claims, 4 Drawing Sheets

LOW STRESS SEMICONDUCTOR DEVICE COATING AND METHOD OF FORMING THEREOF

TECHNICAL FIELD

The present invention relates generally to semiconductor devices and manufacturing methods and more particularly to a semiconductor device having a low stress coating and a method of forming thereof.

BACKGROUND

Polyimide films are frequently used as a protective overcoat for semiconductor devices. Manufacturers commonly apply a polyimide layer to the top of a semiconductor device. This may be done before grinding, dicing, and final packaging of the semiconductor device. The protective overcoat may function as a stress buffer and as an attenuation layer for soft error rate (SER) reduction. The protective overcoat generally protects the delicate device components from damage during handling and moisture penetration.

In a semiconductor device, it is preferable for adjacent layers to have good adhesion to one other. For example, when coating a material such as a copper metallization, adhesion between the dielectric and the copper may be a reliability concern. Localized fracture of the dielectric film near a conducting line may lead to catastrophic failure of the chip. Generally, one cause of fracture is stress arising from a mismatch in coefficients of thermal expansion combined with weak interfacial adhesion.

These problems generally are compounded when low dielectric constant (low-k) materials are used in the device. Recent advances in semiconductor device processing technology are requiring the increased use of low-k (k less than about 3) insulating materials in, for example, intermetal dielectric (IMD) or interlevel dielectric (ILD) layers in multilayer devices. Because the mechanical strength of low-k materials is typically less than that of oxides and glasses, stress between the polyimide layer and the underlying low-k layer or layers may be particularly problematic. This stress may cause fracture, delamination, and cracking in the layers of the semiconductor device.

To address these problems, manufacturers frequently apply polyimide as a protective overcoat upon a device having low-k ILD layers. The overcoat may be formed over the final ILD and metal layers. There may be a passivation layer, e.g., silicon dioxide and/or silicon nitride, formed on the device before formation of the overcoat. Polyimide film formation typically includes such well known processes as polyimide coating, polyimide hardening, resist coating, exposure to light, selective removal of the resist layer for patterning, selective etching of the polyimide film using the resist layer as a mask, and removal of the resist layer. Newer, photo-sensitive, polyimide can be patterned directly without using a resist layer.

As stated earlier, stress arising from a mismatch in coefficients of thermal expansion combined with weak interfacial adhesion can be a major problem with low-k materials. When polyimide film is cured, the film typically shrinks resulting in an extra buildup of tensile stress at corners. The extra tensile stress build-up due to polyimide film shrinkage at corners easily induces layer de-lamination. Localized fracture or delamination of the dielectric film near a conducting line may lead to catastrophic failure of the chip.

A solution to these and other problems is desired because of the rapidly increasing use of low-k materials within the semiconductor industry.

SUMMARY OF THE INVENTION

These and other problems are generally solved or circumvented, and technical advantages are generally achieved, by preferred embodiments of the present invention that provide a device and method for applying a protective, polyimide coating over a low-k material.

In accordance with a preferred embodiment of this invention, a method for fabricating a coated semiconductor device comprises manufacturing a semiconductor device, the device having a top layer and four corners; and, forming a polyimide overcoat on the top layer except for selected corner regions.

Advantages of an embodiment of the present invention are the ease of implementation and low cost. Polyimides have been used for years in the semiconductor industry in the manufacture of printed circuit boards, as an interdielectric layer between conductors, and as a wafer planarization method. Using methods known in the art, polyimides are typically applied as a liquid, cured, and, if desired, patterned. Lithographic patterning of polyimide films is simple and straightforward. The same basic method used for liquid photoresists are available for polyimide processing.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device having a polyimide overcoat overlying a low-k layer, except for a selected region. The invention also applies, for example, to other coating applications in which corner stress or corner delamination may be a problem, for example polymeric materials, such as benzocyclobutene (BCB).

Embodiments of the present invention may be particularly useful with dies comprising low-k materials. An exemplary low-k inorganic material that is frequently used, for example, is carbon doped silicon dioxide (C-oxide) formed by a CVD process in which the dielectric constant may be varied over a range depending on the process conditions. C-oxide, for example, may be formed with dielectric constants over a range of about 2.0 to about 3.0 and a density of about 1.3 g/cm$^3$, compared to dielectric constants of about 4.1 and a density of about 2.3 g/cm$^3$ for standard silicon dioxides (e.g., un-doped TEOS). Other exemplary low-k inorganic materials include porous oxides, aerogels, xerogels, or SOG (spin-on glass). Exemplary low-k organic materials include polysilsequioxane, parylene, polyimide, benzocyclobutene and amorphous PTFE. Preferably, low-k materials have a dielectric constant of less than 3.9, and more preferably less than 3.5, and still more preferably less than 3.0.

Figure 1:
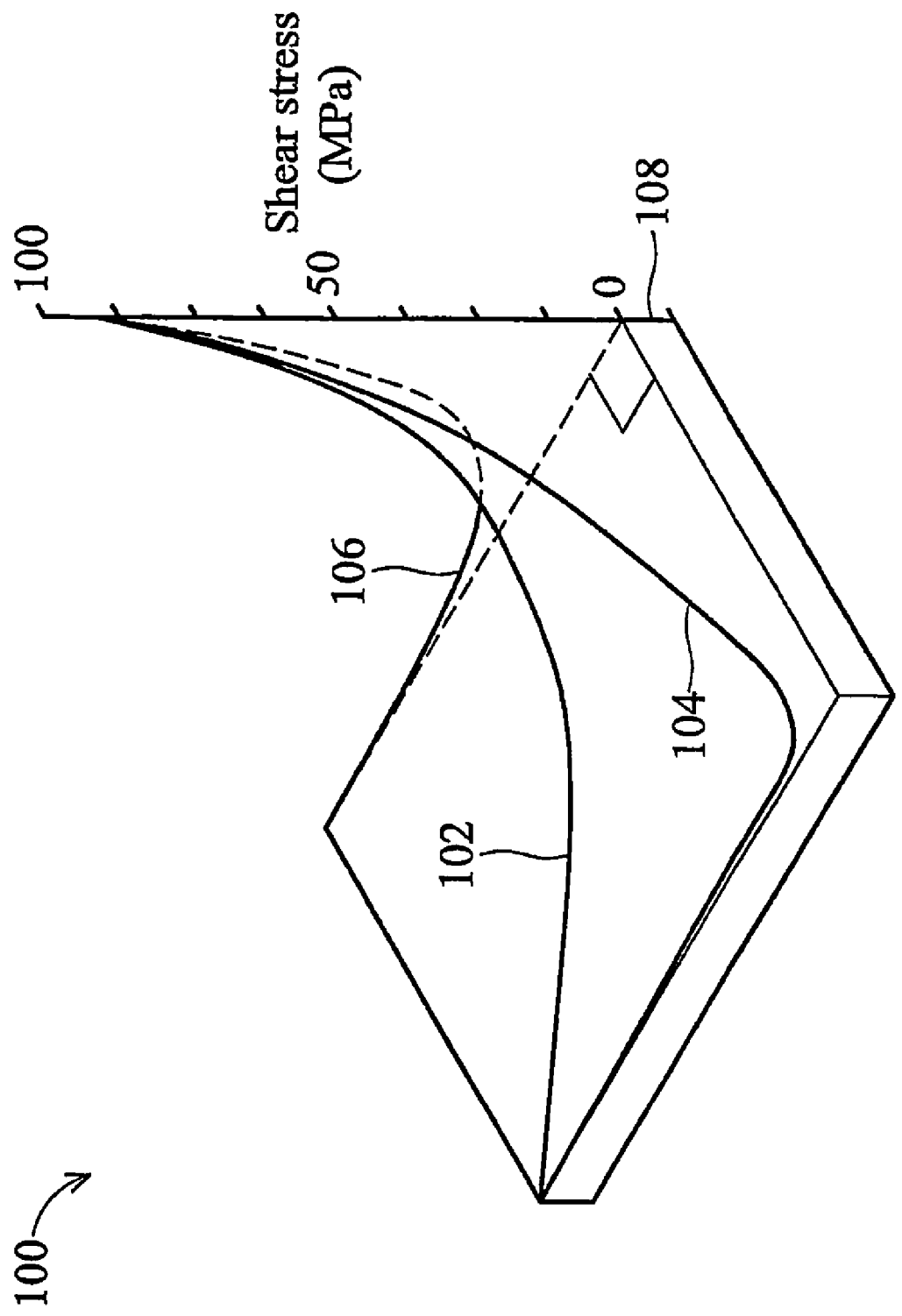
FIG. 1 is a graph showing modeling results for the shear stress in the overcoat layer of a multilayer device.

A finite element computer model was used to calculate the shear stress in a polyimide overcoat layer for a representative, multilayer semiconductor package subjected to thermal cycles. FIG. 1 summarizes the results of these calculations. This figure shows the shear stress in the polyimide layer for a single quadrant of a rectangular, multilayer die 100 that is representative of a polyimide coating on a low-k layer. FIG. 1 displays shear stress along the die diagonal 102, and along the finite element model boundaries, 104 and 106. Shear stress is minimal throughout most of the surface layer, except near the corner of the die 108, where it can be as large as 100 MPa.

Figure 2:
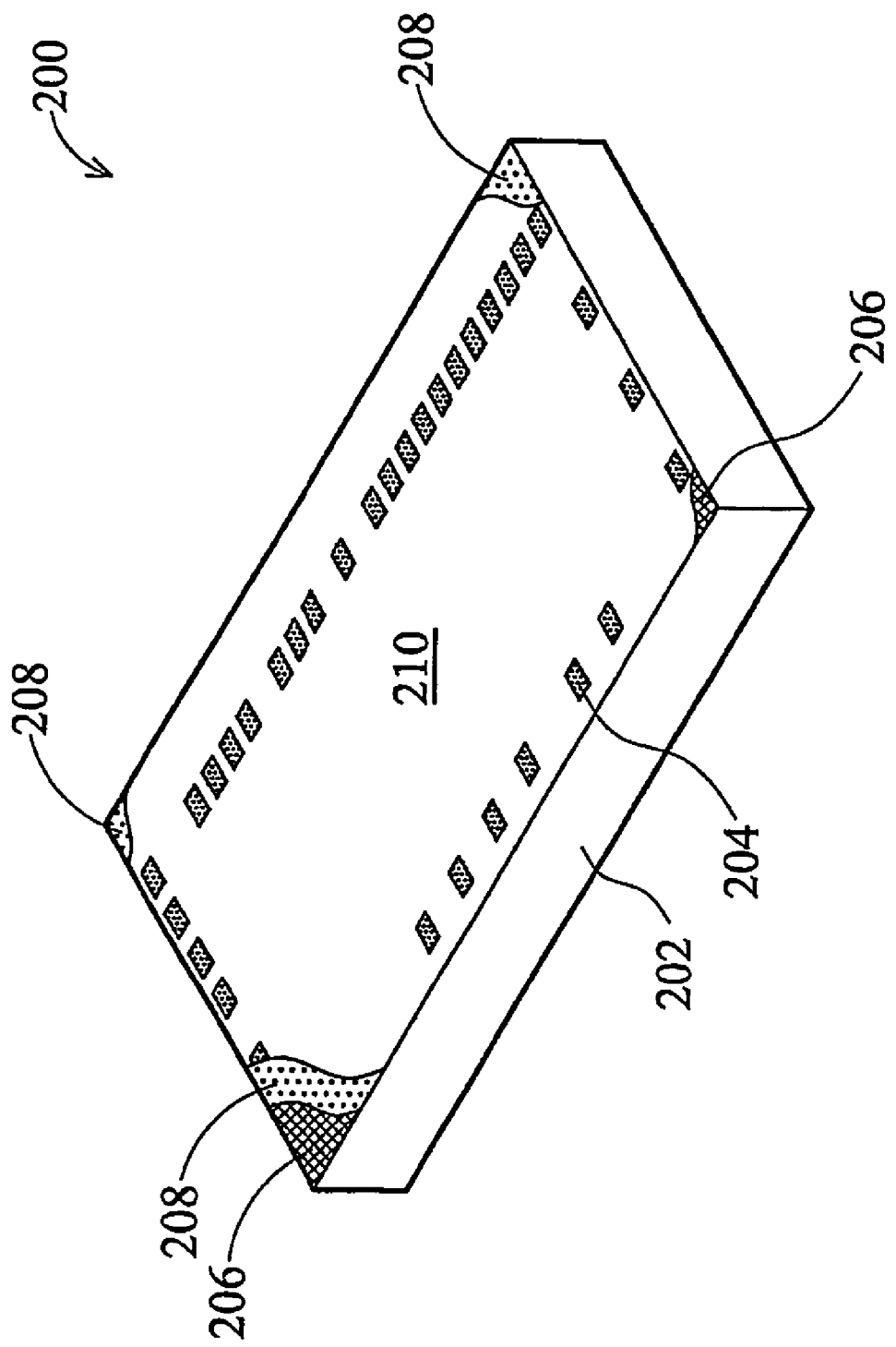
FIG. 2 is a perspective view of a die showing experimental results indicating delamination among inter-dielectric layers of a multilayer device.

Experimental observations confirm the stress modeling results. FIG. 2 shows an experimental device 200 comprising a die 202 having a surface 210, a plurality of ILD layers, a polyimide coating, and plurality of bonding pads 204. The polyimide coating covers a majority of the surface, except for the bond pads 204. The experimental device was subjected to 2000 thermal cycles. The observed ILD delamination is indicated in FIG. 2 after 1000 and 2000 thermal cycles by 206 and 208, respectively. Significant delamination occurred among the inter-level dielectric layers. As expected, delamination commenced at the corners where stress is greatest. Characterization of the delamination showed significant propagation from the corner of the die towards the center between 1000 and 2000 thermal cycles.

With reference now to FIGS. 3a–3d, there are shown a few of the many possible embodiments of the present invention. In these figures, like reference numerals represent like elements among the figures, unless otherwise noted or obvious from the context.

FIGS. 3a–3d show alternative top plan views of one corner portion of a semiconductor die 300. In preferred embodiments, a polyimide overcoat is formed on a device having low-k ILD layers. Polyimide film formation typically includes such well know processes as polyimide coating, polyimide hardening, resist coating, exposure to light, selective removal of the resist layer for patterning, selective etching of the polyimide film using the resist layer as a mask, and removal of the resist layer. During patterning, the polyimide film may be removed from the areas for the bond pads or electrode pads, the areas of the scribe lines, and, if any electrode pads and scribe lines are disposed in close proximity to one another, the gaps there between. The removal of the polyimide film from the areas of the scribe lines generally prevents the dicing blade used in the dicing step from prematurely deteriorating in sharpness. The areas of the electrode pads should be exposed for bonding in a bonding step, and thus are subjected to the removal of the polyimide film.

While FIGS. 3a–3d do not show the entire die surface for clarity, all four corners of the die may be formed in a similar manner. Alternatively, preferred embodiments include implementation on any number of corners of a die from one up to all of the corners. In a preferred embodiment, a polyimide overcoat of a desired thickness is formed on the die surface, except for in a selected region. In preferred embodiments, the selected region occupies at least one corner of the die. An advantage of not forming the polyimide overcoat on the corner regions is that it should be straightforward to manufacture, and should require minimal or no extra processing steps or cost. In addition, one should be able to readily detect whether a die is incorporating an embodiment of the present invention.

Figure 3B:
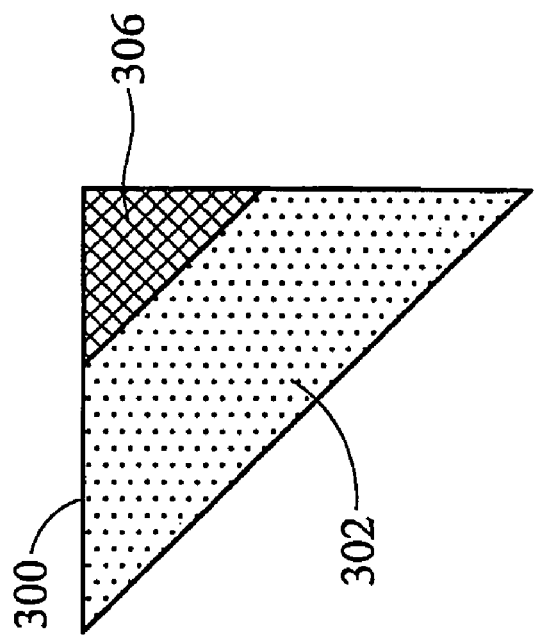
FIGS. 3a–3d are top plan views of embodiments of the present invention wherein a semiconductor device has a polyimide overcoat, except for selected regions at the corners.
Figure 3A:
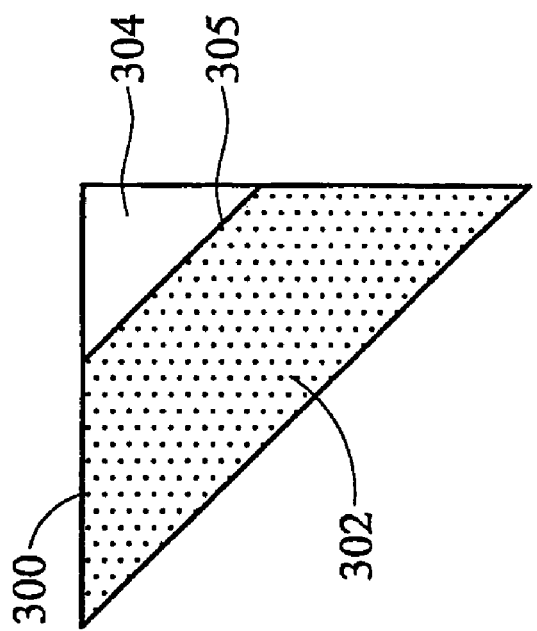

In a preferred embodiment of the present invention, shown in FIG. 3a, a substantially uniform polyimide overcoat 302 is disposed upon the top surface of device 300 except for corner regions 304. Other than the corner regions 304, the overcoat 302 generally is applied to the entire surface of the die except for areas such as the bond pads or scribe lines. Corner region 304 does not have a polyimide overcoat layer. The uncoated corner region 304, as shown in FIG. 3a, forms approximately a right triangle with a boundary 305 between overcoat 302 and uncoated region 304 being its hypotenuse. The triangle sides along the edges of die 300 may be about 5 to 200 microns per side. In a preferred embodiment, the triangle sides along the edges of die 300 are both approximately 150 microns long. Alternatively, one side of the triangle may have a different length than the other side. The polyimide overcoat 302 thickness may be about 1 to 20 microns and preferably about 4 to 6 microns.

In an alternative embodiment of the present invention, shown in FIG. 3b, corner regions 306 are only partially devoid of the polyimide overcoat. In this embodiment, a substantially uniform polyimide overcoat 302 is disposed upon the top surface of the device 300 except at corner regions 306. In corner regions 306, a patterned coating is disposed upon the top surface. The patterned coating is preferably a checkerboard pattern of coated and uncoated rectangles. A checkerboard overcoat also has been shown to be effective in reducing corner stress. The polyimide in the checkerboard advantageously provides some scratching resistance, as compared to bare corners. The pattern may be formed when the polyimide overcoat 302 is formed, or may be formed fully or partially in separate processes.

Alternatively, the corner pattern may comprise different shaped or different sized elements. For example, the pattern may comprise squares, triangles, ovals, circles, irregularly-shaped, or other shaped elements. In addition, the elements may have different relative sizes than those shown in FIG. 3b, or may be different sizes from each other within one embodiment. For example, the size of the elements may be made progressively smaller as one moves from an essentially uniform overcoating 302 out to the corner or edges of the die 300. The surface area of the coated elements in the corner may be the same, less than or greater than the surface area of the uncoated spaces in the corner.

Figure 3D:
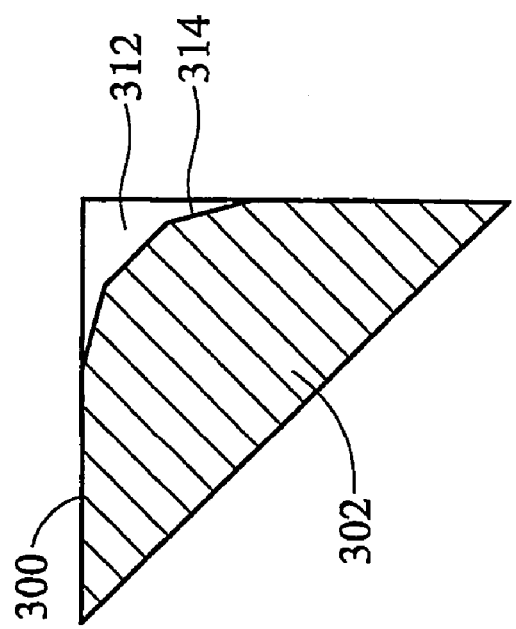
Figure 3C:
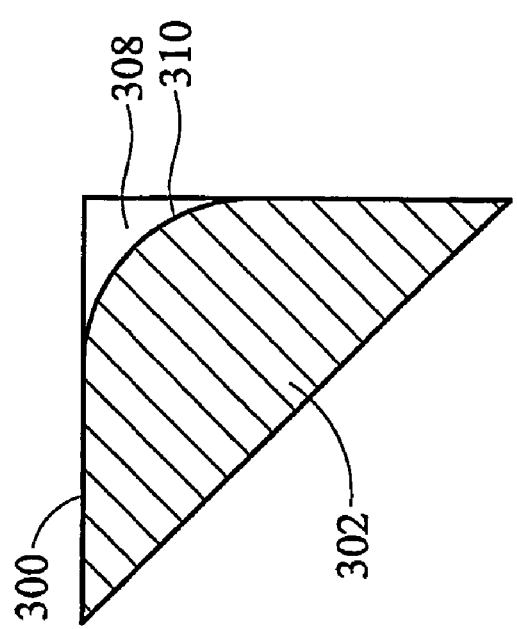

FIG. 3c shows another illustrative embodiment of this invention. A substantially uniform polyimide overcoat 302 is disposed upon the top surface of the die 300 other than corner regions 308. In this embodiment, the uncoated corner region 308 is the same along the edges of the die, but shares a curved boundary 310 with polyimide overcoat 302. Alternatively, the curved boundary 310 may have different a different radius than that shown in FIG. 3c, or it may have different radius values along a single curved boundary.

FIG. 3d shows another preferred embodiment of the present invention. In this embodiment, a substantially uniform polyimide overcoat 302 is disposed upon the top surface of the die 300 except at corner regions 312. The boundary separating the polyimide coating 302 and uncoated corner regions 308 comprises a plurality of facets 314. In this embodiment, there are 3 facets 314, but any number of facets may be used and are considered to be within the scope of the present invention.

Although the present invention and its advantages have been described in detail, it should be understood that various changes, substitutions, and alterations can be made herein without departing from the spirit and scope of the invention as defined by the appended claims. For example, the uncoated surface of the die is not necessarily restricted to the corner regions. In particular, bond pad and scribe line regions may not be coated. Alternatively, an overcoat having an oval shape or the like may be used. In this case, not only would corners of the die be uncoated, but so also would regions along some or all of the edges of the die. As another example, other patterns, such as herringbone, diamond, spider web, star, sphere, plaid, zigzag, or waves, may be used with the corner region 306 of FIG. 3b.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a semiconductor device, the method comprising:
    forming an interlevel dielectric layer on a semiconductor die, the die comprising a corner, and the die comprising a planar corner region on a top surface of the die adjacent the corner;
    forming a metal layer over the interlevel dielectric layer; and
    forming a protective overcoat over the metal layer, wherein the overcoat is not formed over at least the corner region of the die.

2. The method according to claim 1, the die further comprising three other corners, and the die further comprising three other planar corner regions on the top surface of the die adjacent the respective other corners, wherein the overcoat is not formed over at least the other corner regions of the die.

3. The method according to claim 1, wherein the protective overcoat is a polyimide.

4. The method according to claim 1, wherein the protective overcoat has a thickness of between about 4 microns and about 6 microns.

5. The method according to claim 1, wherein the interlevel dielectric comprises a low dielectric constant material.

6. The method according to claim 1, wherein the planar corner region has a triangular shape.

7. The method according to claim 1, wherein the planar corner region has a convex curved boundary with the overcoat.

8. The method according to claim 1, further comprising forming a passivation layer over the metal layer before the forming of the protective overcoat.

9. A method for fabricating a semiconductor device, the method comprising:
    forming an interlevel dielectric layer on a semiconductor die, the die comprising four corners, and the die comprising four planar corner regions on a top surface of the die adjacent the respective corners;
    forming a metal layer over the interlevel dielectric layer;
    forming a protective overcoat over the metal layer; and
    patterning the protective overcoat to form a stress relieving pattern in the corner regions.

10. The method according to claim 9, wherein the protective overcoat comprises a polyimide.

11. The method according to claim 9, wherein the interlevel dielectric layer has a dielectric constant less than about 3.5.

12. The method according to claim 9, wherein the protective overcoat has a thickness of between about 4 microns and about 6 microns.

13. The method according to claim 9, wherein the stress relieving pattern comprises a plurality of spaced elements.

14. The method according to claim 13, wherein the elements are rectangles.

15. The method according to claim 9, wherein the patterning of the protective overcoat comprises removing the overcoat from the corner regions.

16. The method according to claim 9, wherein the metal layer comprises bond pads, the method further comprising removing the protective overcoat from areas overlying the bond pads.

17. The method according to claim 9, wherein each of the corner regions has a triangular shape.

18. A semiconductor package comprising:
    a semiconductor substrate having a corner, and having a planar corner region on a top surface of the substrate adjacent the corner;
    an interlevel dielectric layer overlying the semiconductor substrate;
    a metal layer overlying the interlevel dielectric layer; and
    a protective coating overlying the metal layer, wherein the coating is not disposed on at least the corner region of the die.

19. The semiconductor package of claim 18, the substrate further comprising three other corners, and the substrate further comprising three other planar corner regions on the top surface of the substrate adjacent the respective other corners, wherein the coating is not disposed on at least the other corner regions of the die.

20. The semiconductor package of claim 18, wherein the coating is a polyimide.

21. The semiconductor package of claim 18, wherein the coating has a thickness of between about 4 microns and about 6 microns.

22. The semiconductor package of claim 18, wherein the interlevel dielectric layer comprises a low dielectric constant material.

23. The semiconductor package of claim 18, wherein the corner region comprises a triangular shape.

24. The semiconductor package of claim 18, wherein the corner region comprises a multi-faceted boundary with the protective coating.

25. The semiconductor package of claim 18, further comprising a passivation layer disposed between the metal layer and the protective coating.

26. A semiconductor device comprising:
- a semiconductor die having four corners and four planar corner regions on a top surface of the die adjacent the respective corners;
- an interlevel dielectric layer overlying the semiconductor die;
- a metal layer overlying the interlevel dielectric layer;
- a protective overcoat overlying the metal layer, wherein the protective overcoat comprises a stress relieving pattern in the corner regions.

27. The semiconductor device of claim 26, wherein the protective overcoat comprises a polyimide.

28. The semiconductor device of claim 26, wherein the protective overcoat has a thickness of between about 4 microns and about 6 microns.

29. The semiconductor device of claim 26, wherein the interlevel dielectric has a dielectric constant less than about 3.5.

30. The semiconductor device of claim 26, wherein the stress relieving pattern comprises a plurality of spaced elements.

31. The semiconductor device of claim 30, wherein the elements are rectangles.

32. The semiconductor device of claim 26, wherein the metal layer comprises bond pads, wherein the protective overcoat does not overlie the bond pads.

33. The semiconductor device of claim 26, wherein each of the corner regions has a triangular shape.

* * * * *